United States Patent
Leobandung

(10) Patent No.: US 10,312,160 B2
(45) Date of Patent: Jun. 4, 2019

(54) GATE-LAST SEMICONDUCTOR FABRICATION WITH NEGATIVE-TONE RESOLUTION ENHANCEMENT

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 15/606,927

(22) Filed: May 26, 2017

(65) Prior Publication Data

US 2018/0342428 A1   Nov. 29, 2018

(51) Int. Cl.
*H01L 21/84* (2006.01)
*H01L 21/8258* (2006.01)
*H01L 29/51* (2006.01)
*H01L 29/267* (2006.01)
*H01L 27/12* (2006.01)

(52) U.S. Cl.
CPC ........ *H01L 21/845* (2013.01); *H01L 21/8258* (2013.01); *H01L 27/1211* (2013.01); *H01L 29/267* (2013.01); *H01L 29/517* (2013.01)

(58) Field of Classification Search
CPC .................................................. H01L 21/845
USPC ........................................................ 257/192
See application file for complete search history.

(56) References Cited

U.S. PATENT DOCUMENTS

| 8,304,841 | B2 | 11/2012 | Xu et al. | |
|---|---|---|---|---|
| 2014/0048881 | A1* | 2/2014 | Kanike | H01L 29/66545 257/347 |
| 2014/0124840 | A1* | 5/2014 | Khakifirooz | H01L 29/66545 257/288 |
| 2015/0228762 | A1* | 8/2015 | He | H01L 29/66795 257/410 |
| 2015/0243745 | A1* | 8/2015 | Kelly | H01L 29/41766 257/369 |
| 2016/0365309 | A1* | 12/2016 | Zhang | H01L 29/42384 |

\* cited by examiner

*Primary Examiner* — Igwe U Anya
(74) *Attorney, Agent, or Firm* — L. Jeffrey Kelly, Esq.; Hoffmann & Baron, LLP

(57) ABSTRACT

A method of fabricating a transistor includes: forming an active device layer on a semiconductor substrate; patterning the active device layer to form fins; forming a first dielectric layer on an upper surface and sidewalls of the fins; forming a second dielectric layer on the first dielectric layer; forming openings through the first and second dielectric layers, exposing the underlying active device layer forming the fins; forming source/drain regions in the active device layer exposed through the respective openings; forming source/drain contacts on an upper surface of the source/drain regions; forming a second opening through the first and second dielectric layers, exposing the underlying active device layer adjacent to the source/drain regions; depositing a third dielectric layer in the second opening, on sidewalls and an upper surface of the fins; and forming a gate stack on the third dielectric layer.

15 Claims, 8 Drawing Sheets

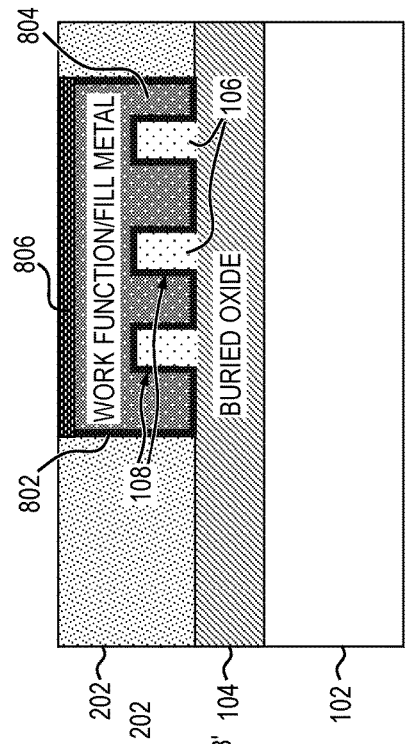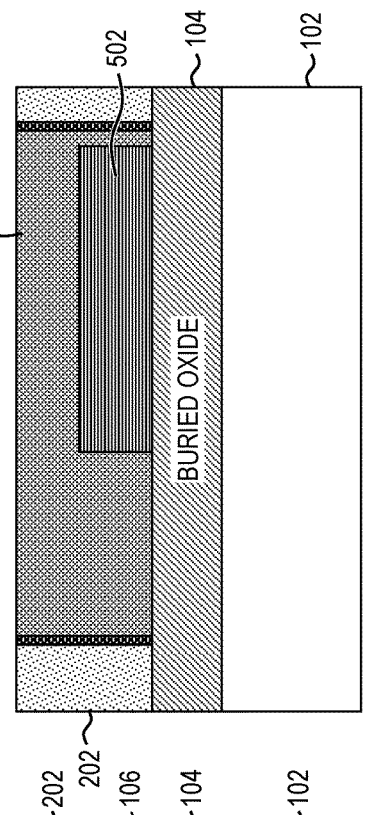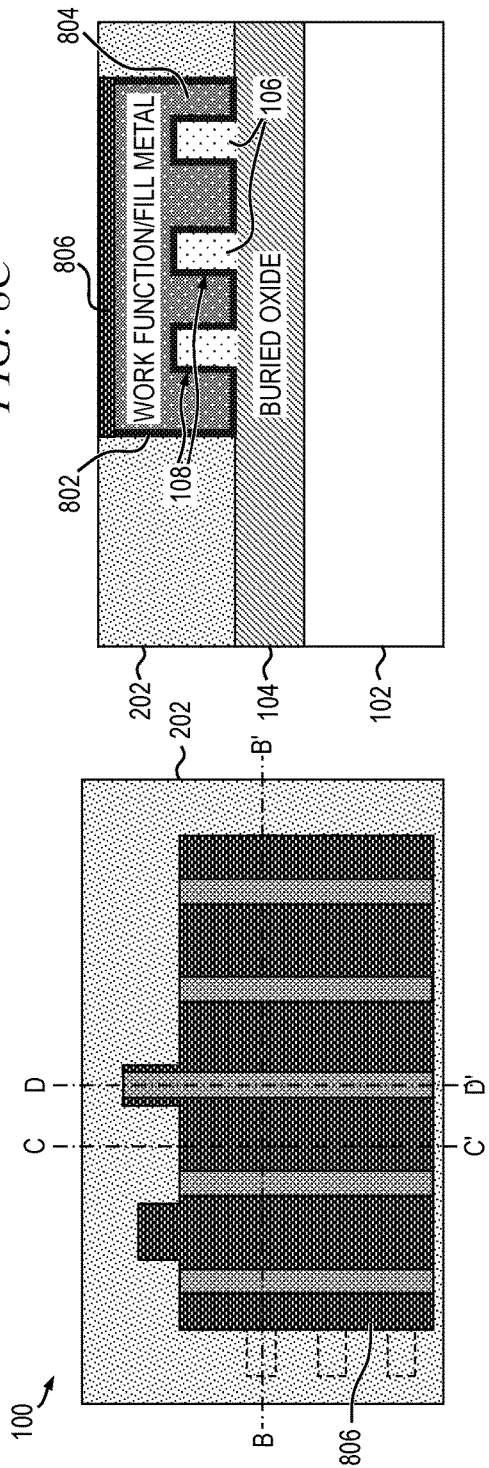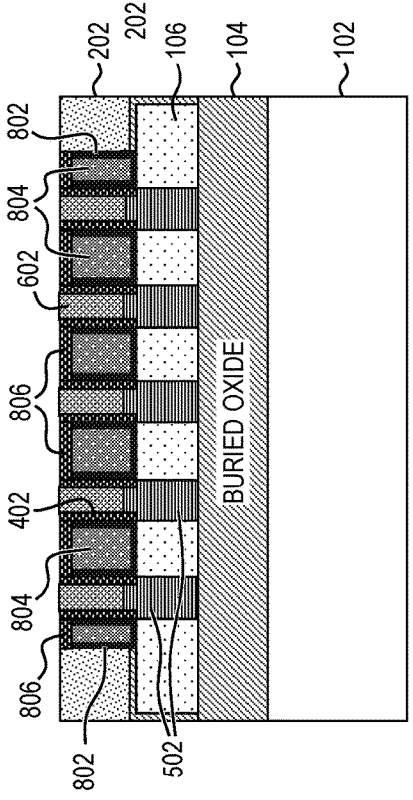

GATE-LAST SEMICONDUCTOR FABRICATION WITH NEGATIVE-TONE RESOLUTION ENHANCEMENT

BACKGROUND

The present invention relates generally to the electrical, electronic and computer arts, and, more particularly, to semiconductor devices and fabrication.

In an effort to increase the density of circuit elements within a semiconductor device, the dimensions of the elements are often scaled down. The ability to shrink certain dimensions, such as gate length, can be limited due to the particular performance requirements of the device, including operating voltage, leakage current, gate capacitance, etc. For example, polysilicon gates are adversely affected by poly depletion which can significantly reduce performance. When a metal-oxide-semiconductor field-effect transistor (MOSFET) is operated in an inversion mode, part of the applied gate voltage is dropped in the polysilicon due to poor conductivity of the polysilicon. A metal gate, which offers superior conductivity, may be used, but a metal gate is susceptible to metal migration during subsequent processing operations that are performed at elevated temperatures.

Another problem with high density devices is precise control of gate lengths. As device dimensions continue to shrink, precise control of gate lengths becomes critical to assure performance. One method for controlling gate lengths is by using a dummy or replacement gate process. In a replacement gate process, a dummy gate is formed of silicon dioxide or a polymer such as photoresist. An oxide layer is formed over the dummy gate. The dummy gate is removed thereby creating a gate opening, and a desired gate material is deposited into the gate opening at a subsequent stage in the fabrication process. One problem with existing replacement gate processes is the limited ability to control the height of the dummy gate during removal of the overlying dielectric layer. Also, the etching process to form contact openings can cause oxidation of the source and drain regions, leading to higher source and drain resistances.

SUMMARY

Aspects according to one or more embodiments of the present invention relate to a novel transistor structure formed using a gate-last semiconductor process flow with negative-tone resolution enhancement. More particularly, a transistor structure formed in accordance with one or more embodiments of the invention includes a gate that is patterned as a trench, rather than as a freestanding line as is conventionally done. In one or more embodiments, since the gate of the transistor device is formed after formation of source/drain regions in the device, self-alignment of the gate to source drain using the source/drain regions is performed.

In one aspect, the invention relates to a method of fabricating a transistor structure. The method includes: forming an active device layer on a semiconductor substrate; patterning the active device layer to form a plurality of fins; forming a first dielectric layer on at least a portion of an upper surface and sidewalls of the plurality of fins; forming a second dielectric layer on at least a portion of an upper surface of the first dielectric layer; forming a first plurality of openings through the second dielectric layer and the first dielectric layer, exposing the underlying active device layer forming the plurality of fins; forming a plurality of source/drain regions in the active device layer exposed through the respective first plurality of openings; forming a plurality of source/drain contacts on an upper surface of each of the plurality of source/drain regions; forming a second opening through the second dielectric layer and the first dielectric layer, the second opening exposing the underlying active device layer adjacent to the plurality of source/drain regions; depositing a third dielectric layer in at least a portion of the second opening, including on sidewalls of the second opening and sidewalls and an upper surface of the plurality of fins; and forming a gate stack on the third dielectric layer, the gate stack being self-aligned with the plurality of source/drain regions.

In a further aspect, the invention relates to a gate-last transistor structure fabricated using negative-tone resolution enhancement. The transistor structure includes an active device layer formed on an upper surface of a substrate, the active device layer patterned to form a plurality of fins, a plurality of source/drain regions formed in the active device layer, the fins passing through the source/drain regions, and a plurality of source/drain contacts formed on upper surfaces of the respective source/drain regions for providing electrical connection to the source/drain regions. The transistor structure further includes a plurality of gate structures formed between adjacent source/drain regions, the gate structures being electrically isolated from the active device layer by a gate dielectric layer formed between the active device layer and the respective gate structures. The gate structures are formed subsequent to forming the source/drain regions and are self-aligned with the source/drain regions. Each of at least a subset of the gate structures are confined between a pair of adjacent source/drain contacts proximate a gate region where contact to the gate structure is formed.

Techniques as disclosed herein can provide substantial beneficial technical effects. By way of example only and without limitation, one or more embodiments may provide one or more of the following advantages:

reduces detrimental standing wave effects and proximity effects caused by device scaling;

reduces tilting in high aspect ratio gate freestanding line problems;

less prone to extreme ultraviolet (EUV) mask defects since it is negative tone;

allows lower temperature source/drain epitaxy which beneficially facilitates the use of Group III-V materials for source/drain regions;

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIGS. 1A through 8D are top plan and corresponding cross-sectional views depicting intermediate processing steps in an overall semiconductor fabrication methodology for forming an active semiconductor device comprising a gate patterned as a trench, according to one or more embodiments of the invention.

Figure 1A:
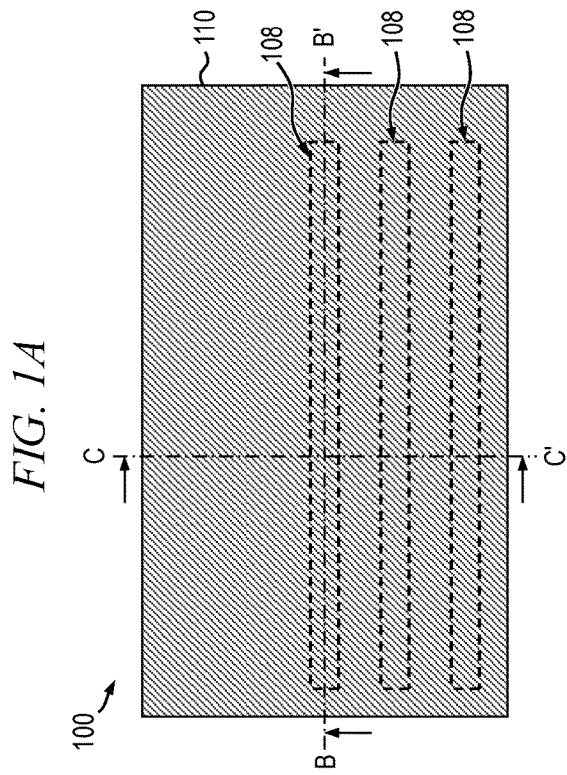
Figure 1C:
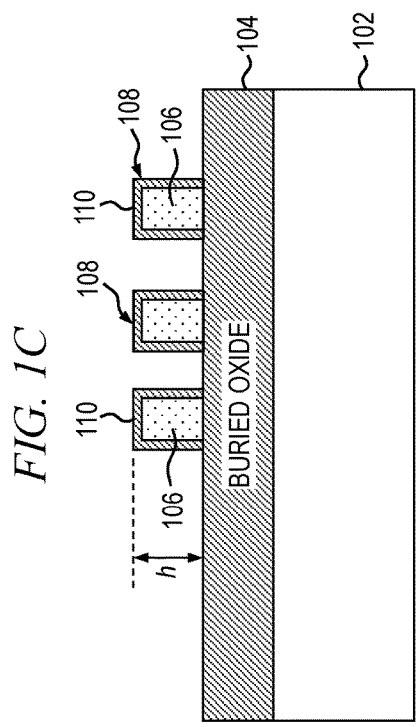
Figure 1B:
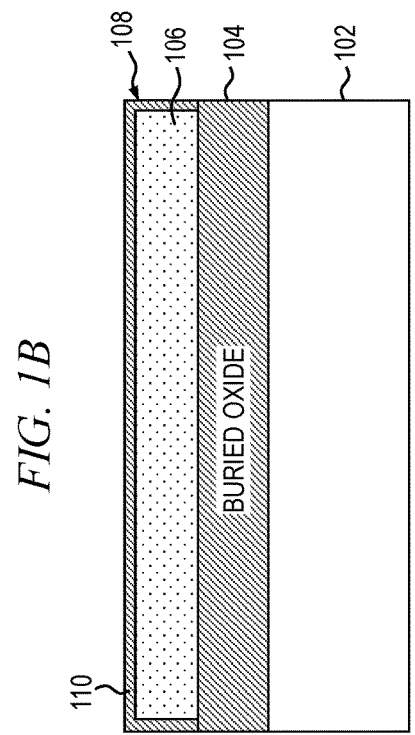

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative transistor devices having at least one gate patterned as a trench, and methods of fabricating such devices. It is to be appreciated, however, that the specific structures and/or methods illustratively shown and described herein are to be considered exemplary as opposed to limiting. Moreover, it will become apparent to those skilled in the art given the teachings herein that numerous modifications can be made to the embodiments shown that are within the scope of the appended claims. That is, no limitations with respect to the embodiments shown and described herein are intended or should be inferred.

Although the overall fabrication method and the structures for the disclosed embodiments are entirely novel, certain individual processing steps required to implement the structure and/or circuitry may utilize conventional semiconductor fabrication techniques and conventional semiconductor fabrication tooling. These techniques and tooling will already be familiar to one having ordinary skill in the relevant art given the teachings herein. Moreover, many of the processing steps and tooling used to fabricate semiconductor devices are also described in a number of readily available publications, including, for example: James D. Plummer et al., *Silicon VLSI Technology*, Prentice Hall; 2 edition (Nov. 11, 2008); and James D. Plummer et al., *Silicon VLSI Technology: Fundamentals, Practice, and Modeling*, Pearson; 1 edition (Jul. 24, 2000), both of which are hereby incorporated by reference herein in their entireties. It is emphasized that while some individual processing steps may be set forth herein, those steps are merely illustrative, and one skilled in the art may be familiar with several equally suitable alternatives that would also fall within the scope of the invention.

It is to be appreciated that the various layers, regions, structures and/or components shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

As previously stated, as metal-oxide-semiconductor (MOS) transistor device geometries are reduced to increase density, the conventional method of patterning the MOS gate as a freestanding line produces several problems. Specifically, contact lithography offers high resolution (down to about the wavelength of the radiation), but practical problems such as mask damage and resulting low yield make this process unusable in most production environments. Proximity printing reduces mask damage by keeping the mask a set distance above the wafer (e.g., 20 µm). Unfortunately, the resolution limit is increased to greater than 2 to 4 µm, making proximity printing insufficient for modern technology. By far the most common method of exposure is projection printing.

In the context of semiconductor fabrication, resolution—the smallest feature that can be printed with adequate control—has two basic limits: the smallest image that can be projected onto the wafer, and the resolving capability of the photoresist to make use of that image. From a projection imaging perspective, resolution is determined by the wavelength of the imaging light ($\lambda$) and the numerical aperture (NA) of the projection lens.

Another important aspect of photoresist exposure is what is often referred to as a standing wave effect. Monochromatic light, when projected onto a wafer, strikes the photoresist surface over a range of angles, approximating plane waves. This light travels down through the photoresist and, if the substrate is reflective, is reflected back up through the resist. The incoming and reflected light interfere with one another to form a standing wave pattern of high and low light intensity at different depths in the photoresist. This pattern is replicated in the photoresist, causing ridges to form in the sidewalls of the resist feature. As pattern dimensions become smaller, these ridges can significantly affect the quality of the feature. The interference that causes standing waves also results in a phenomenon called swing curves, the sinusoidal variation in linewidth with changing resist thickness.

Proximity effects are another cause of problems when device dimensions are scaled. Proximity effects are typically defined as variations in the linewidth of a feature (or the shape for a two-dimensional pattern) as a function of the proximity of other nearby features. The concept of proximity effects became prominent when it was observed that electron beam lithography can cause backscattered electrons to travel many microns, exposing photoresist at nearby features. Optical proximity effects refer to those proximity effects that occur during optical lithography (even though they may not necessarily be caused by optical phenomenon). One simple example of an optical proximity effect is the difference in printed linewidth between an isolated line and a line in a dense array of equal lines and spaces (called iso-dense print bias). Thus, as gate dimensions and spacing are reduced, optical proximity effects become more manifest.

In order to reduce disadvantageous effects caused by patterning the gate as a freestanding line, embodiments of the invention beneficially pattern the gate as a trench. Even using a conventional trench-gate fabrication process, whereby a polysilicon dummy gate is replaced with a metal gate in a later process stage, which may ultimately form a trench-like structure, the gate is still initially patterned as a freestanding line and therefore exhibits the same detrimental effects. Advantages of embodiments of the invention include, but are not limited to, reducing detrimental standing wave effects and proximity effects caused by device scaling, reducing tilting in high aspect ratio freestanding line problems, reducing the impact of extreme ultraviolet (EUV) mask defects, and allowing lower temperature source/drain epitaxy which beneficially facilitates the use of Group III-V materials for source/drain regions, as will be described in further detail below.

FIGS. 1A through 8D are top plan and corresponding cross-sectional views depicting various intermediate processing steps in an overall semiconductor fabrication methodology for forming an active semiconductor device (e.g., MOS transistor) comprising a gate patterned as a trench, according to one or more embodiments of the invention. With reference to FIGS. 1A-1C, FIG. 1A is a top plan view of at least a portion of an exemplary MOS transistor structure 100, FIG. 1B is a cross-sectional view of the illustrative structure 100 shown in FIG. 1A taken along line B-B', and FIG. 1C is a cross-sectional view of the illustrative structure 100 shown in FIG. 1A taken along line C-C'. The MOS transistor structure 100, in one or more embodiments, is formed on a silicon-on-insulator (SOI) substrate comprising a carrier substrate 102, which may be formed of silicon or an alternative material suitable for use as a substrate (e.g., germanium (Ge), gallium arsenide (GaAs), indium phosphide (InP), etc.), an oxide (e.g., silicon dioxide) or other insulating layer 104 formed on at least a portion of an upper surface of the substrate, and an active device layer 106 formed on at least a portion of an upper surface of the oxide layer.

The active device layer 106 may be formed of silicon having a prescribed conductivity type (e.g., n-type or p-type) associated therewith, such as by using a standard doping process. Since the oxide layer 104 is formed between the substrate 102 and active device layer 106, it is often referred to as a buried oxide (BOX) layer. The active device layer 106, buried oxide layer 104 and substrate 102 are considered elements of the SOI substrate. Although the transistor structure 100 will be described herein in the context of an SOI substrate, it is to be appreciated that the transistor structure may be similarly formed on a bulk silicon wafer in one or more embodiments of the invention, wherein layer 104 does not exist and the device is isolated with shallow trench isolation (STI) structures or other methods.

In one or more embodiments, the active device layer 106 is patterned using, for example, a standard lithographic process (e.g., photolithographic mask followed by etching) to form a plurality of fins 108. In one or more embodiments, a height, h, of the fins 108 above an upper surface of the buried oxide layer 104 is about 30 nanometers (nm), although embodiments of the invention are not restricted to any particular dimensions and/or shapes. Furthermore, embodiments of the invention are not limited to any particular number of fins 108 formed on the transistor structure 100. It is to be appreciated that although the transistor structure 100 will be described herein in the context of a fin-type field-effect transistor (FinFET) device, aspects of the invention may be similarly used in the formation of other device types, such as, for example, planar devices and/or nanowires, as will become apparent to those skilled in the art given the teachings herein.

In one or more embodiments, a thin oxide layer 110 is formed on at least a portion of an upper surface and sidewalls of the active device layer 106, covering the fins 108. The thin oxide layer 110 preferably comprises an oxide, such as, for example, silicon dioxide ($SiO_2$), although other dielectric materials (e.g., silicon nitride ($Si_3N_4$)) may be similarly employed, despite being referred to as an oxide layer. The oxide layer 110, in one or more embodiments, may be formed by oxidizing the underlying silicon active device layer 106 to form $SiO_2$, although other means of forming the thin oxide layer are contemplated (e.g., deposition, etc.). A thickness of the thin oxide layer 110 is preferably about 1-2 nm, although embodiments of the invention are not limited to any specific thickness of the thin oxide layer.

Figure 2A:
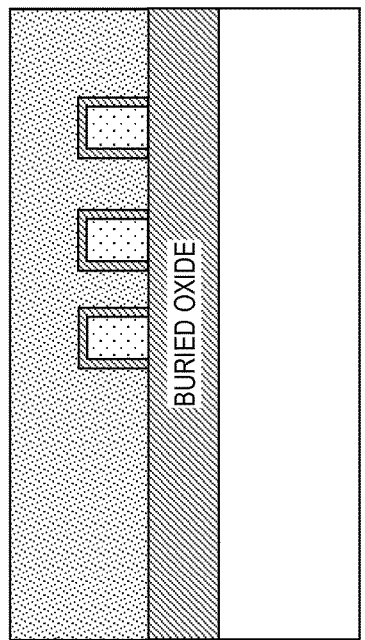
Figure 2B:
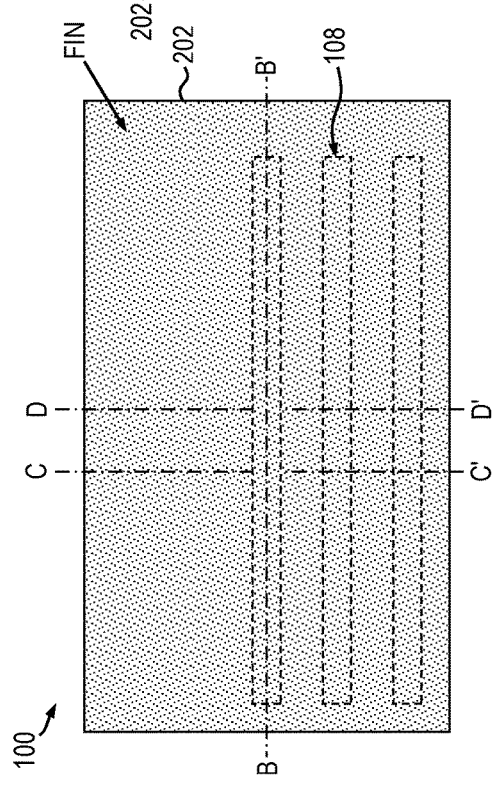
Figure 2C:
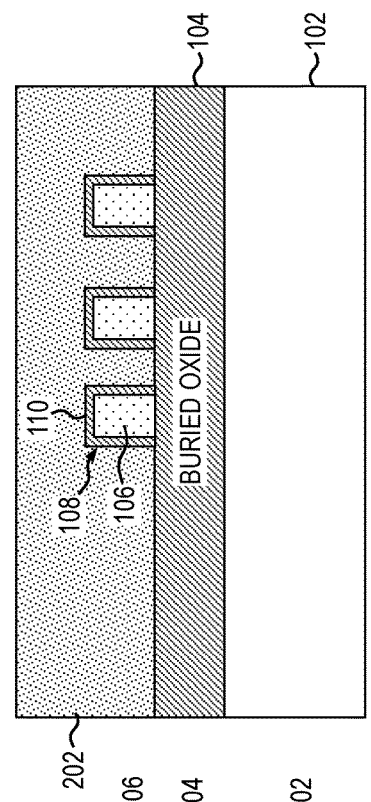
Figure 2D:
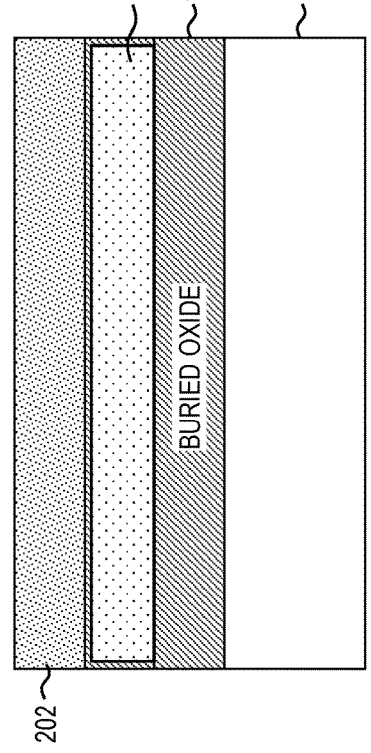

FIGS. 2A through 2D depict a subsequent stage (low-k dielectric layer deposition) in the processing of the transistor structure 100, according to an embodiment of the invention; FIG. 2A is a top plan view of at least a portion of the exemplary MOS transistor structure 100, FIG. 2B is a cross-sectional view of the illustrative structure 100 shown in FIG. 2A taken along line B-B', FIG. 2C is a cross-sectional view of the illustrative structure 100 shown in FIG. 2A taken along line C-C', and FIG. 2D is a cross-sectional view of the illustrative structure 100 shown in FIG. 2A taken along line D-D'. Specifically, FIGS. 2A through 2D illustrate the formation of a low-dielectric constant (low-k) layer 202 on at least a portion of an upper surface of the thin oxide layer 110 for middle-of-line contact formation. In this embodiment, the dielectric layer 202 is preferably formed using an oxide deposition process, followed by a planarization process, such as chemical mechanical polishing/planarization (CMP) or the like. In one or more embodiments, the dielectric layer 202 is formed of low-k carbon-doped oxide (e.g., SiCOH or porous oxide) or carbon-doped nitride (e.g., SiBCN) material, although embodiments of the invention are not limited to these materials.

Figure 3C:
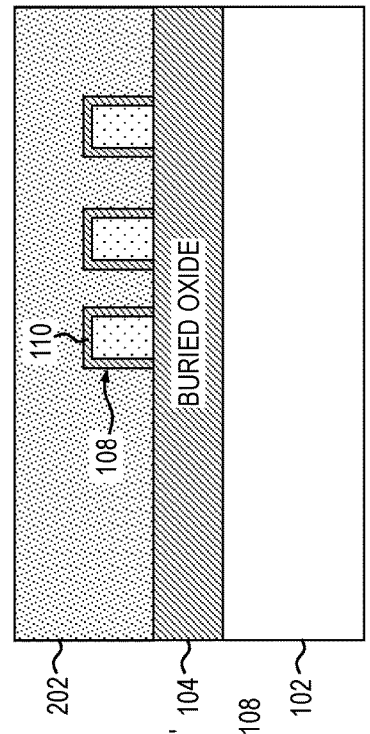
Figure 3D:
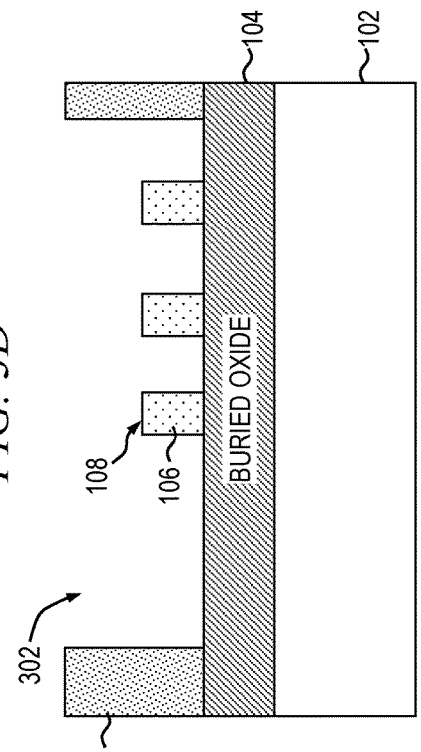
Figure 3A:
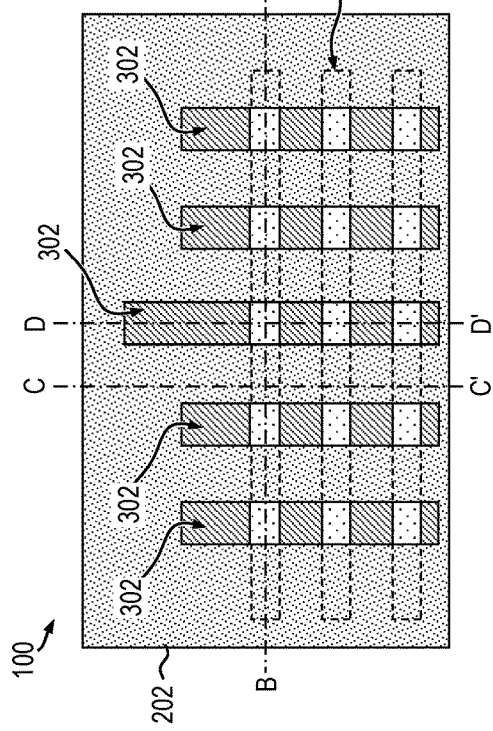
Figure 3B:
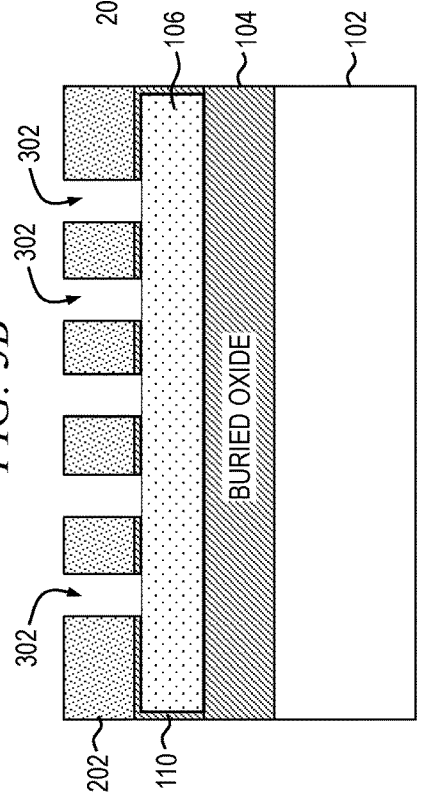

FIGS. 3A through 3D depict an exemplary pattern contact and etch processing stage in the fabrication of the transistor structure 100, according to an embodiment of the invention; FIG. 3A is a top plan view of at least a portion of the exemplary MOS transistor structure 100, FIG. 3B is a cross-sectional view of the illustrative structure 100 shown in FIG. 3A taken along line B-B', FIG. 3C is a cross-sectional view of the illustrative structure 100 shown in FIG. 3A taken along line C-C', and FIG. 3D is a cross-sectional view of the illustrative structure 100 shown in FIG. 3A taken along line D-D'. Specifically, as shown in FIGS. 3A-3D, a plurality of openings 302 are formed through the dielectric layer 202 and the thin oxide layer 110, exposing the underlying active device layer 106 and buried oxide layer 104. In one or more embodiments, the openings 302 are formed using a standard lithographic patterning and etching process. In a standard lithographic patterning process, a light sensitive polymer, called a photoresist, is exposed and developed to transfer a three-dimensional relief image, referred to as a hard mask, onto the upper surface of the wafer; in this case, the upper surface of the dielectric layer 202. The wafer is then etched so that areas/layers of the wafer not protected by the hard mask are removed; a depth of the etching will be a function of one or characteristics, such as the type etchant used, the type(s) of material(s) being etched and the length of time that the wafer is exposed to the etchant, among other factors. Etching may be achieved using reactive ion etching (ME), although other etching methodologies are similarly contemplated (e.g., plasma etch, a wet etch (e.g., hydrofluoric (HF) acid), etc.). One or more layers of the structure may serve as an etch-stop layer, particularly when a selective etchant is employed. Although embodiments of the invention are not limited to a particular etchant, a selective etchant is preferably utilized which is not reactive with the active device layer 106.

In this illustrative embodiment, the openings 302 are oriented in a direction substantially perpendicular to a major axis direction of the fins 108. Areas in the active device layer 106 exposed through the openings 302 will form source/drain regions of the transistor structure 100 during a subsequent processing step, as will be described in conjunction with FIGS. 5A-5D.

Figure 4C:
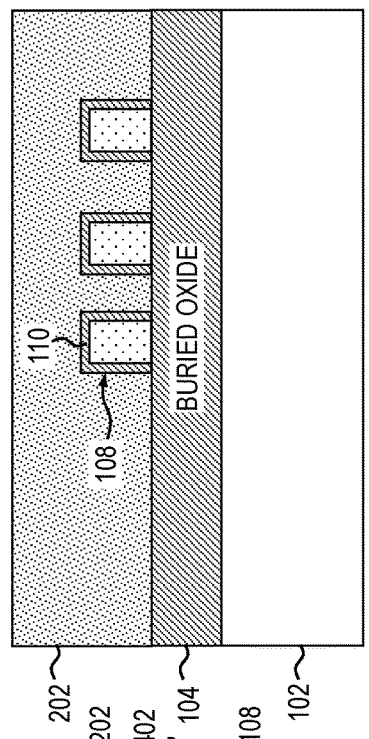
Figure 4A:
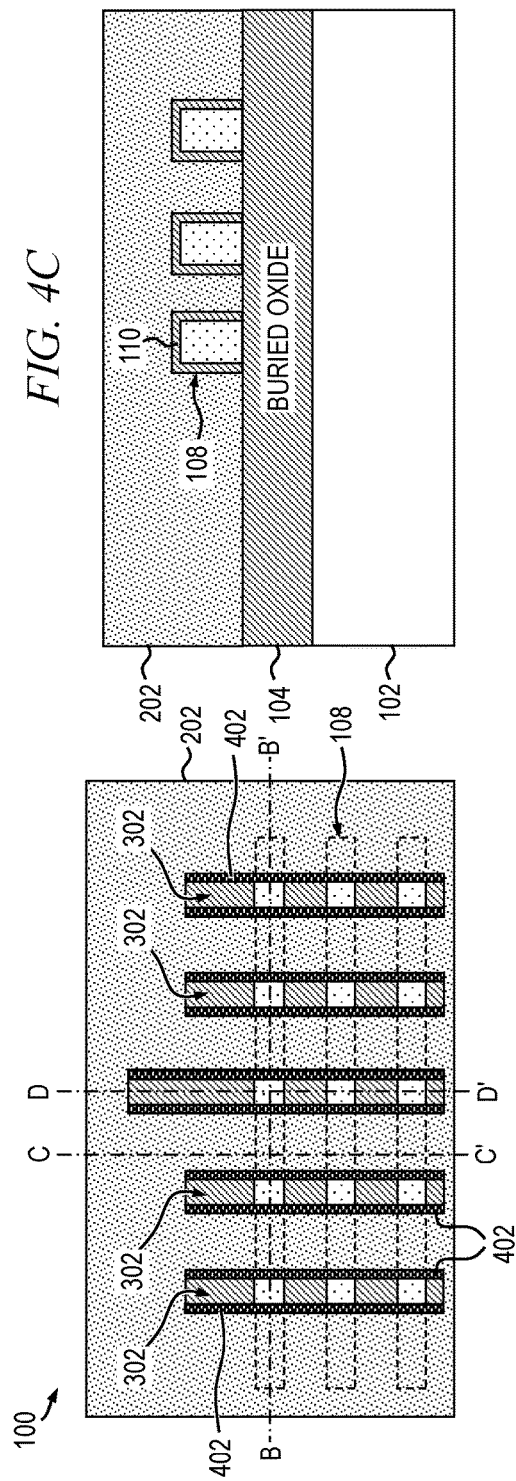
Figure 4D:
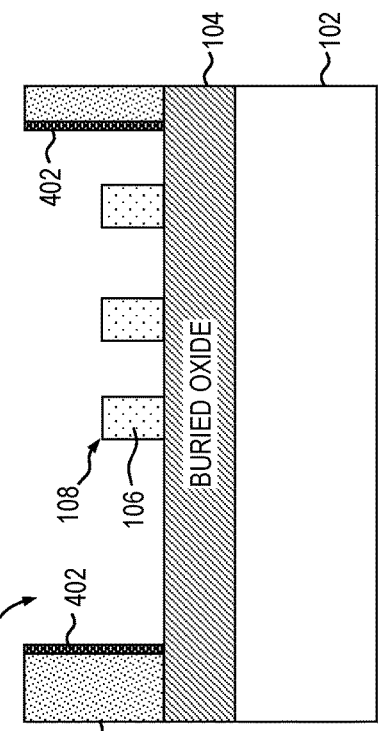
Figure 4B:
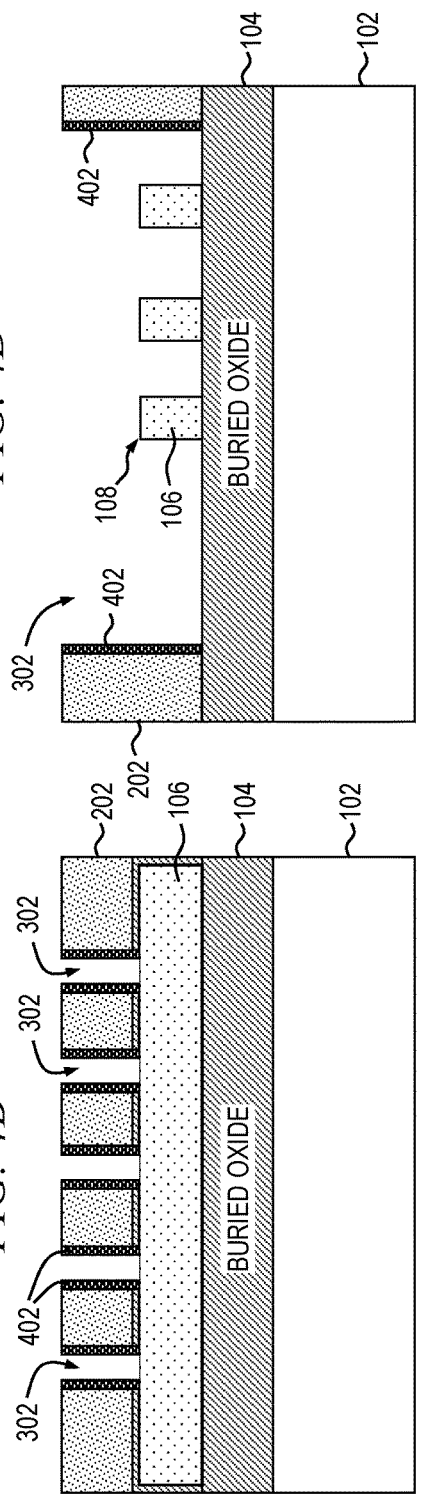

Prior to formation of heavily-doped source/drain regions in the transistor structure 100, dielectric spacers 402 are formed on sidewalls of the openings 302, as shown in FIGS. 4A through 4D; FIG. 4A is a top plan view of at least a portion of the exemplary MOS transistor structure 100, FIG. 4B is a cross-sectional view of the illustrative structure 100 shown in FIG. 4A taken along line B-B', FIG. 4C is a cross-sectional view of the illustrative structure 100 shown in FIG. 4A taken along line C-C', and FIG. 4D is a cross-sectional view of the illustrative structure 100 shown in FIG. 4A taken along line D-D'. The sidewall spacers 402, in one or more embodiments, are formed by chemical vapor deposition (CVD) of silicon dioxide from a low-density plasma source created within a reaction chamber. Other methods and materials for forming the sidewall spacers are contemplated in alternative embodiments (e.g., atomic layer deposition (ALD of titanium oxide). The sidewall spacers 402 may be optionally formed to reduce parasitic overlap capacitance ($C_{ov}$).

Figure 5A:
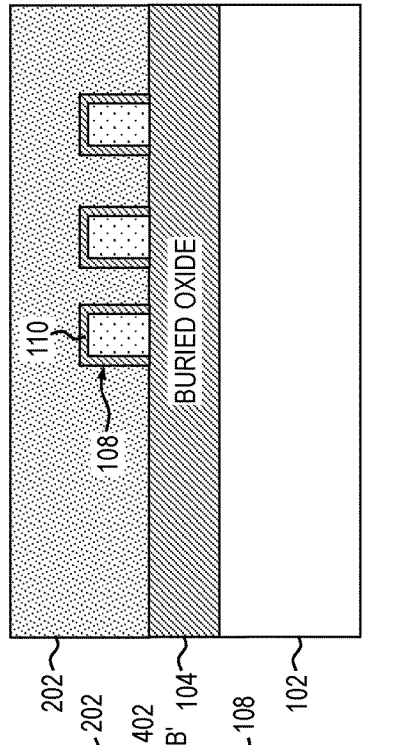
Figure 5B:
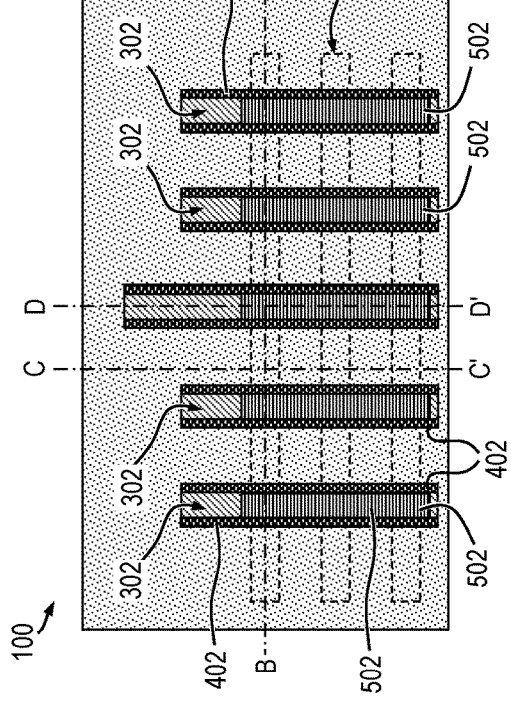
Figure 5C:
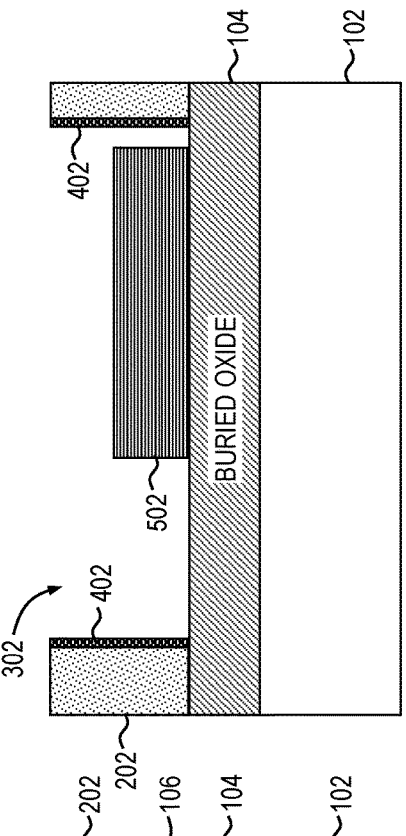
Figure 5D:
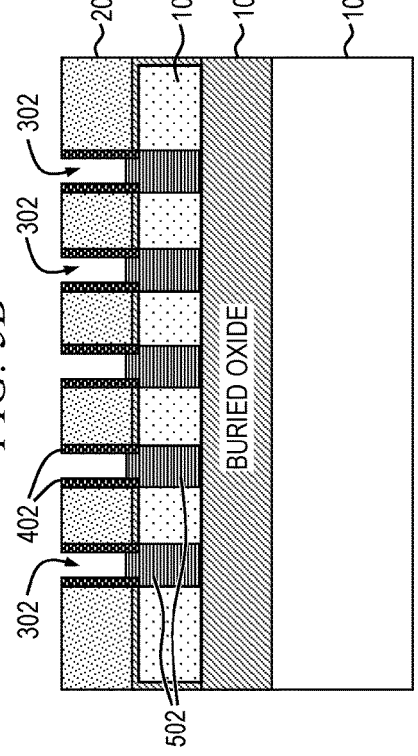

FIGS. 5A through 5D depict the formation of source/drain regions in the transistor structure 100, according to an embodiment of the invention; FIG. 5A is a top plan view of at least a portion of the exemplary MOS transistor structure 100, FIG. 5B is a cross-sectional view of the illustrative structure 100 shown in FIG. 5A taken along line B-B', FIG. 5C is a cross-sectional view of the illustrative structure 100 shown in FIG. 5A taken along line C-C', and FIG. 5D is a cross-sectional view of the illustrative structure 100 shown in FIG. 5A taken along line D-D'. With reference to FIGS. 5A-5D, source/drain regions 502 are formed in at least a portion of the openings 302 covering the fins 108 using, for example, an epitaxial growth process, such as, for example, chemical vapor deposition (CVD), molecular beam epitaxy (MBE), or metal organic chemical vapor deposition (MOCVD) epitaxy, etc., the fins 108 passing orthogonally through the source/drain regions 502 in one or more embodiments.

The source/drain regions 502, in one or more embodiments, are doped during epitaxial deposition by adding impurities to the source gas, such as arsine, phosphine or diborane, depending on the desired conductivity type of the source/drain regions. The concentration of impurity in the gas phase determines its concentration in the deposited epitaxial layer. An anneal process is used, in one or more embodiments, to drive the impurity into the source/drain regions 502, with the source/drain regions extending laterally in the active device layer 106 so as to have a width that is greater than a width of the openings 302, as shown more clearly in FIG. 5B. Forming the source/drain regions 502 in this manner, prior to formation of the gate, allows lower temperature source/drain epitaxy which beneficially facilitates the use of Group III-V materials, such as, for example, indium gallium arsenide (InGaAs), gallium arsenide (GaAs), indium phosphide (InP), etc., for the source/drain regions.

Figure 6A:
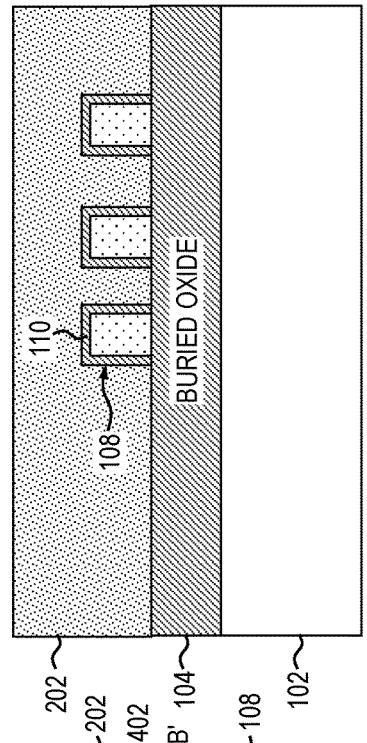
Figure 6B:
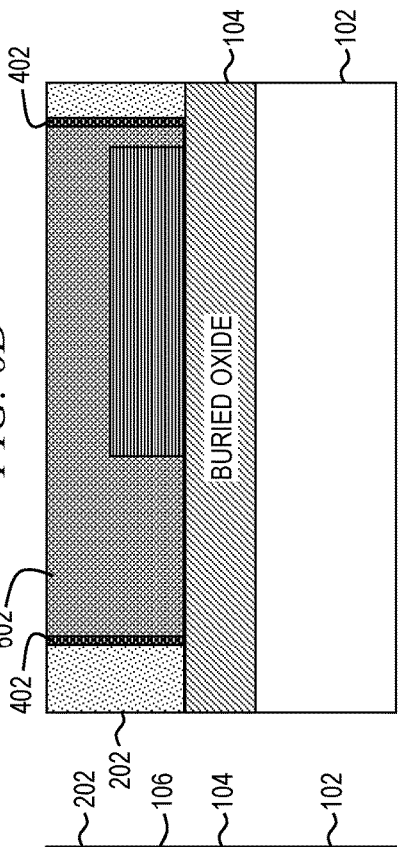
Figure 6C:
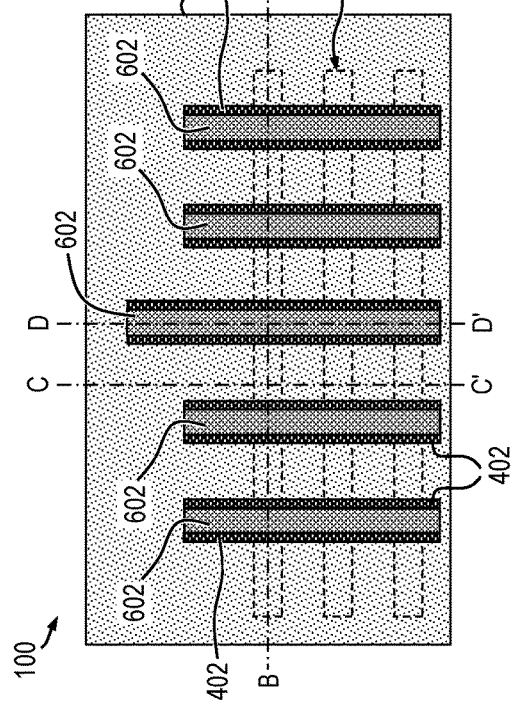
Figure 6D:
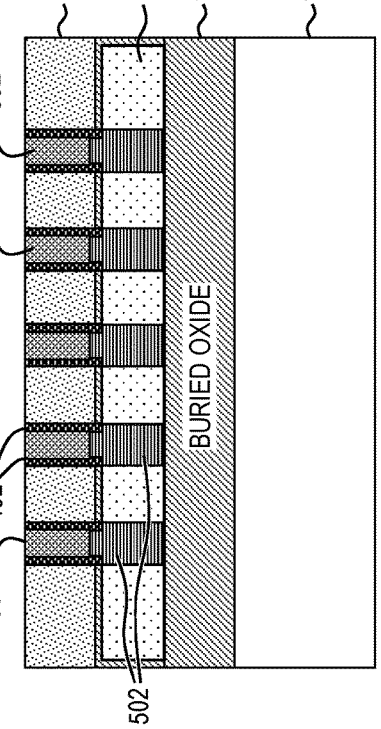

In one or more embodiments, contact metal 602, or an alternative conductive material, is then deposited in the openings 302, substantially filling the openings, as depicted in FIGS. 6A through 6D; FIG. 6A is a top plan view of at least a portion of the exemplary MOS transistor structure 100, FIG. 6B is a cross-sectional view of the illustrative structure 100 shown in FIG. 6A taken along line B-B', FIG. 6C is a cross-sectional view of the illustrative structure 100 shown in FIG. 6A taken along line C-C', and FIG. 6D is a cross-sectional view of the illustrative structure 100 shown in FIG. 6A taken along line D-D'. The contact metal 602, which may be formed using a deposition process (e.g., physical vapor deposition (PVD)), is in electrical connection with the underlying source/drain regions 502. Suitable materials for forming the contact metal 602 include, but are not limited to, titanium (Ti), titanium nitride (TiN), tungsten (W), etc.

Figure 7A:
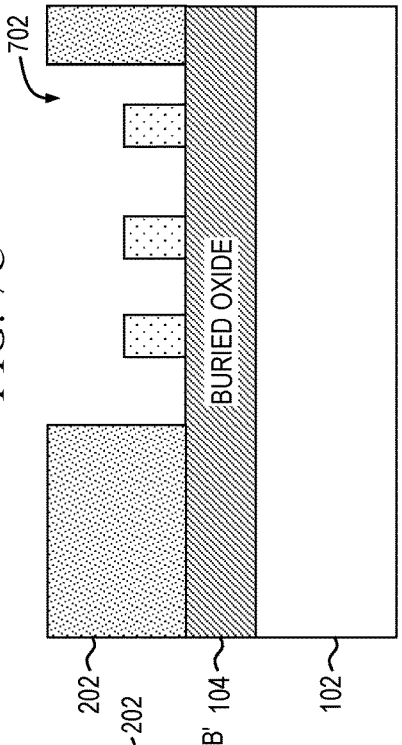
Figure 7B:
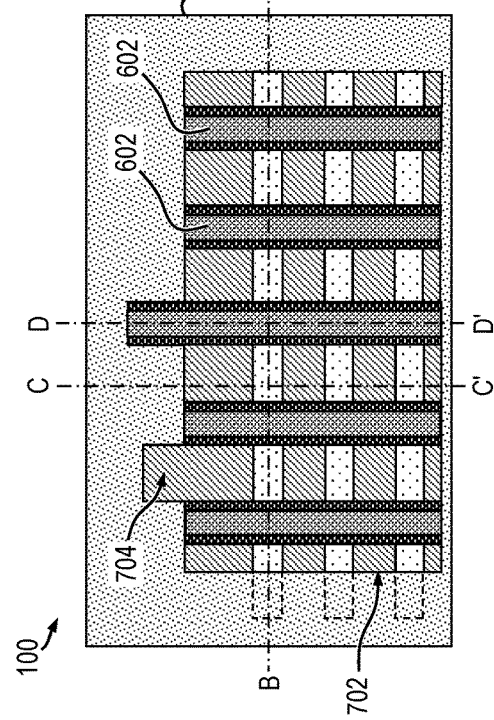
Figure 7C:
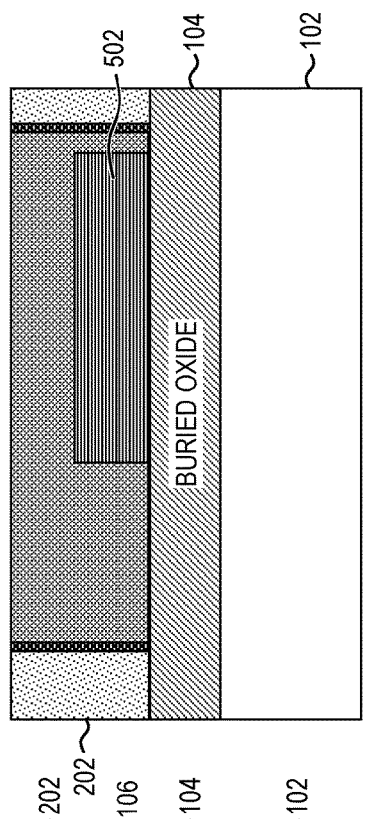
Figure 7D:
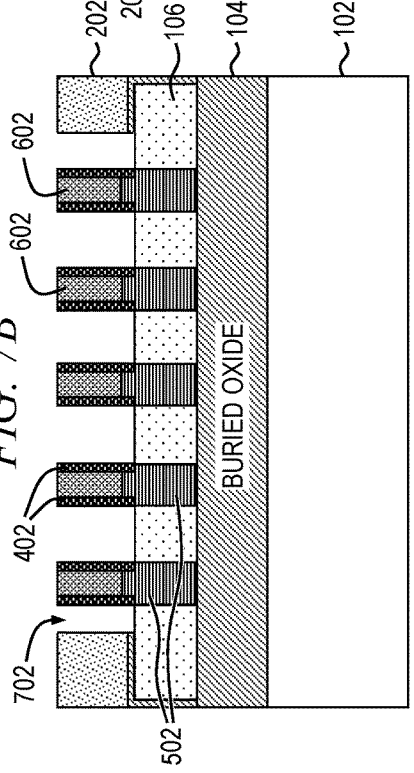

Once the source/drain regions 502 and contact metal 602 are formed, a plurality of gates are patterned and etched in the transistor 100, according to one or more embodiments of the invention, as shown in FIGS. 7A through 7D, where FIG. 7A is a top plan view of at least a portion of the exemplary MOS transistor structure 100, FIG. 7B is a cross-sectional view of the illustrative structure 100 shown in FIG. 7A taken along line B-B', FIG. 7C is a cross-sectional view of the illustrative structure 100 shown in FIG. 7A taken along line C-C', and FIG. 7D is a cross-sectional view of the illustrative structure 100 shown in FIG. 7A taken along line D-D'. With reference now to FIGS. 7A-7D, in forming the gates, an opening or trench 702 is formed through the dielectric layer 202 by patterning an area extending beyond the source/drain regions 502 and selectively etching the patterned area so as to expose the underlying active device layer 106 between adjacent source/drain regions. The etchant is selected so as to be non-reactive with the sidewall spacers 402 and contact metal 602, such that the sidewall spacers and contact metal are left intact. The gates of the transistor 100 will ultimately be formed in the areas between adjacent source/drain regions 502.

Optionally, in one or more embodiments, the patterned boundary defined by the opening or trench 702 may be extended in one or more areas, such as represented by extended area 704. This extended area 704 facilitates the formation of an enlarged gate configured to make contact to the gate outside of the device area where needed. It is to be appreciated that the dimensions and/or shape of the extended area 704 are not limited, according to embodiments of the invention. Area 704 can also be included for each gate.

FIGS. 8A through 8D depict the formation of gate structures in the transistor 100, according to an embodiment of the invention; FIG. 8A is a top plan view of at least a portion of the exemplary MOS transistor structure 100, FIG. 8B is a cross-sectional view of the illustrative structure 100 shown in FIG. 8A taken along line B-B', FIG. 8C is a cross-sectional view of the illustrative structure 100 shown in FIG. 8A taken along line C-C', and FIG. 8D is a cross-sectional view of the illustrative structure 100 shown in FIG. 8A taken along line D-D'. Specifically, in one or more embodiments a high-k dielectric layer 802 is deposited in at least a portion of the opening 702, including on sidewalls of the opening, sidewalls of the spacers 402, an upper surface of the active device layer 106 which is exposed through the opening 702, an upper surface of the buried oxide layer 104 exposed through the opening 702, and sidewalls and a top surface of the fin structures 108 exposed through the opening. The high-k dielectric layer 802 thus forms an insulating barrier lining the openings between adjacent source/drain contact metal structures 602. This dielectric layer 802 will form a gate oxide layer electrically isolating the gate from the underlying active device layer 106.

The dielectric layer 802, in one or more embodiments, is formed using a deposition process, such as, for example, atomic layer deposition (ALD), although other means for forming the dielectric layer 802 are similarly contemplated, including, but not limited to, oxide growth, plasma deposition, etc. In one or more embodiments, a cross-sectional thickness of the dielectric layer 802 is about 1-3 nm, although embodiments of the invention are not limited to any particular thickness of the dielectric layer.

Once the dielectric layer 802 has been formed, the opening 702 is filled with a conductive material to form a gate stack 804. The gate stack 804, in one or more embodiments, comprises a metallic compound, such as, for example, atomic layer deposition (ALD) of a metallic compound (e.g., titanium nitride (TiN), tantalum nitride (TaN), titanium aluminum nitride (TiAlN), tantalum aluminum nitride (TaAlN), titanium silicon nitride (TiSiN), tungsten aluminum nitride (WAlN), etc.) configured to provide a prescribed work function. In other words, the composition of the material(s) used to form the gate stack 804 are "tuned," in one or more embodiments, to provide a desired work function.

The gate stack 804 is formed, in one or more embodiments, using a deposition process, such as, for example, atomic layer deposition (ALD), plasma deposition, CVD, or the like. Gate stack 804, in one or more embodiments, may comprise multiple metal layers. A hard mask 806 may be formed over the gate stack 804 which serves as a protection layer for the gate if contact to source drain are needed. The hard mask 806 may, in one or more embodiments, be formed of the same material as the sidewall spacers 402, although the invention is not limited to any particular material. It is to be appreciated that since the gate stack 804 of the transistor structure 100 is formed after formation of source/drain regions 502 in the device, self-alignment of the gate using the source/drain regions is performed.

Given the discussion thus far, it will be appreciated that, in general terms, an exemplary method for fabricating a transistor structure includes: forming an active device layer on a semiconductor substrate, the active device layer having a prescribed conductivity type associated therewith; patterning the active device layer to form a plurality of fins; forming a first dielectric layer on at least a portion of an upper surface and sidewalls of the plurality of fins; forming a second dielectric layer on at least a portion of an upper surface of the first dielectric layer; forming a first plurality of openings through the second dielectric layer and the first dielectric layer, exposing the underlying active device layer forming the plurality of fins; forming a plurality of source/drain regions in the active device layer exposed through the respective first plurality of openings; forming a plurality of source/drain contacts on an upper surface of each of the plurality of source/drain regions; forming a second opening through the second dielectric layer and the first dielectric layer, the second opening exposing the underlying active device layer adjacent to the plurality of source/drain regions; depositing a third dielectric layer in at least a portion of the second opening, including on sidewalls of the second opening and sidewalls and an upper surface of the plurality of fins; and forming a gate stack on the third dielectric layer, the gate stack being self-aligned with the plurality of source/drain regions.

Given the discussion thus far, it will be appreciated that, in general terms, an exemplary gate-last transistor structure fabricated using negative-tone resolution enhancement techniques includes an active device layer formed on an upper surface of a substrate, the active device layer patterned to form a plurality of fins, a plurality of source/drain regions formed in the active device layer, the fins passing through the source/drain regions, and a plurality of source/drain contacts formed on upper surfaces of the plurality of source/drain regions for providing electrical connection to the respective source/drain regions. The transistor structure further includes a plurality of gate structures formed between adjacent source/drain regions, the gate structures being electrically isolated from the active device layer by a gate dielectric layer formed between the active device layer and the respective gate structures. The gate structures being formed subsequent to forming the source/drain regions and are self-aligned with the source/drain regions. Each of at least a subset of the gate structures are confined between a pair of adjacent source/drain contacts proximate a gate region where contact to the gate structure is formed.

At least a portion of the methods and apparatus described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having transistor or other active semiconductor devices formed in accordance with one or more of the exemplary embodiments.

The illustrations of embodiments described herein are intended to provide a general understanding of the various embodiments, and they are not intended to serve as a complete description of all the elements and/or features of methods and apparatus that might make use of the structures and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of exemplary methods described herein may occur out of the order described or noted in the figures (where shown). For example, two steps described or shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below," where used, are intended to indicate positioning of elements or structures relative to each other as opposed to absolute elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of fabricating a transistor structure, the method comprising:
    forming an active device layer on a semiconductor substrate;
    patterning the active device layer to form a plurality of fins;
    forming a first dielectric layer on at least a portion of an upper surface and sidewalls of the plurality of fins;
    forming a second dielectric layer on at least a portion of an upper surface of the first dielectric layer;
    forming a first plurality of openings through the second dielectric layer and the first dielectric layer, exposing the underlying active device layer forming the plurality of fins;
    forming a plurality of source/drain regions in the active device layer exposed through the respective first plurality of openings;
    forming a plurality of source/drain contacts on an upper surface of each of the plurality of source/drain regions;
    forming a second opening through the second dielectric layer and the first dielectric layer, the second opening exposing the underlying active device layer adjacent to the plurality of source/drain regions;
    depositing a third dielectric layer in at least a portion of the second opening, including on sidewalls of the second opening and sidewalls and an upper surface of the plurality of fins;
    patterning a trench, the trench configured for forming a gate; and
    forming the gate on the third dielectric layer using the patterned trench.

2. The method of claim 1, wherein the gate is formed subsequent to the formation of the source/drain regions, the gate being self-aligned with the plurality of source/drain regions.

3. The method of claim 1, further comprising forming dielectric spacers on sidewalls of the first plurality of openings prior to forming the plurality of source/drain regions.

4. The method of claim 1, wherein the third dielectric layer comprises a high dielectric constant material and forms an insulating barrier lining openings between adjacent source/drain contacts.

5. The method of claim 4, wherein the third dielectric layer comprises at least one of hafnium oxide (HfO), zirconium oxide (ZrO), and aluminum oxide (Al2O3).

6. The method of claim 1, wherein the third dielectric layer is formed having a cross-sectional thickness of about one to three nanometers (nm).

7. The method of claim 1, wherein forming the gate comprises:
    depositing a conductive material having a prescribed work function associated therewith in the second opening on an upper surface of the third dielectric layer; and
    depositing a hard mask layer on an upper surface of the conductive material.

8. The method of claim 1, wherein the first plurality of openings are oriented in a direction substantially perpendicular to a major axis direction of the plurality of fins.

9. The method of claim 1, wherein each of at least a subset of the source/drain regions comprises a Group III-V material.

10. The method of claim 9, wherein the Group III-V material comprises at least one of indium gallium arsenide (InGaAs), gallium arsenide (GaAs) and indium phosphide (InP).

11. The method of claim 1, wherein forming the source/drain regions comprises doping the source/drain regions during epitaxial deposition by adding at least one impurity to a source gas, a type and amount of the at least one impurity being varied as a function of a desired conductivity type and impurity concentration, respectively, of the source/drain regions.

12. The method of claim 1, wherein the substrate is a silicon-on-insulator (SOI) substrate comprising a carrier substrate, an insulating layer formed on at least a portion of an upper surface of the carrier substrate, and the active device layer formed on at least a portion of an upper surface of the insulating layer.

13. The method of claim 1, wherein a vertical height of at least a subset of the plurality of fins above an upper surface of the substrate is about 30 nanometers.

14. The method of claim 1, wherein the source/drain regions are formed in at least a portion of the first plurality of openings covering the plurality of fins by an epitaxial growth process.

15. The method of claim 14, wherein the epitaxial growth process comprises at least one of chemical vapor deposition, molecular beam epitaxy, and metal organic chemical vapor deposition epitaxy.

* * * * *